United States Patent
Yang et al.

(10) Patent No.: US 9,558,986 B2
(45) Date of Patent: Jan. 31, 2017

(54) SEMICONDUCTOR STRUCTURE AND MANUFACTURING METHOD THEREOF

(71) Applicant: TAIWAN SEMICONDUCTOR MANUFACTURING COMPANY LTD., Hsinchu (TW)

(72) Inventors: Tai-I Yang, Hsinchu (TW); Hong-Seng Shue, Hsinchu County (TW); Kun-Ming Huang, Taipei (TW); Chih-Heng Shen, Hsinchu County (TW); Po-Tao Chu, New Taipei (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 81 days.

(21) Appl. No.: 14/030,156

(22) Filed: Sep. 18, 2013

(65) Prior Publication Data

US 2015/0076660 A1    Mar. 19, 2015

(51) Int. Cl.
| | |
|---|---|
| *H01L 21/26* | (2006.01) |
| *H01L 29/16* | (2006.01) |
| *H01L 21/00* | (2006.01) |
| *H01L 29/06* | (2006.01) |
| *H01L 21/76* | (2006.01) |
| *H01L 21/762* | (2006.01) |
| *H01L 29/78* | (2006.01) |

(52) U.S. Cl.
CPC ..... *H01L 21/76224* (2013.01); *H01L 29/0634* (2013.01); *H01L 29/78* (2013.01)

(58) Field of Classification Search
CPC .. H01L 21/26506; H01L 29/167; H01L 21/00; H01L 29/0847; H01L 21/26513
USPC ......... 257/607; 438/407, 520, 528, 548, 918
See application file for complete search history.

(56) References Cited

U.S. PATENT DOCUMENTS

| | | | |
|---|---|---|---|
| 6,888,195 B2* | 5/2005 | Saito et al. | 257/328 |
| 2005/0116313 A1* | 6/2005 | Lee et al. | 257/500 |
| 2005/0170587 A1* | 8/2005 | Izumisawa et al. | 438/270 |
| 2008/0237774 A1* | 10/2008 | Ono et al. | 257/492 |
| 2008/0246085 A1* | 10/2008 | Saito et al. | 257/342 |
| 2009/0159969 A1* | 6/2009 | Lorenti et al. | 257/337 |
| 2010/0163846 A1* | 7/2010 | Yilmaz et al. | 257/24 |
| 2011/0049615 A1* | 3/2011 | Saito et al. | 257/329 |
| 2011/0049638 A1* | 3/2011 | Saggio | H01L 29/0634 257/368 |
| 2011/0227147 A1* | 9/2011 | Li et al. | 257/329 |
| 2011/0241111 A1* | 10/2011 | Tamaki et al. | 257/342 |
| 2013/0134487 A1* | 5/2013 | Lin et al. | 257/288 |

\* cited by examiner

*Primary Examiner* — John C Ingham
*Assistant Examiner* — Didarul Mazumder
(74) *Attorney, Agent, or Firm* — WPAT, P.C.; Anthony King

(57) ABSTRACT

A semiconductor structure includes a semiconductor substrate, a first doped region, a second doped region and a dielectric. The first doped region and the second doped region respectively has an aspect ratio and a dopant concentration uniformity along a depth in the semiconductor substrate. The dielectric is between the first doped region and the second doped region. The dopant concentration uniformity is within 0.2% and the aspect ratio of the semiconductor substrate is greater than about 10.

14 Claims, 19 Drawing Sheets

US 9,558,986 B2

SEMICONDUCTOR STRUCTURE AND MANUFACTURING METHOD THEREOF

FIELD

The disclosure relates to a semiconductor structure and a method thereof, and more particularly to a semiconductor structure with a super junction and a method thereof.

BACKGROUND

Semiconductor device is widely adopted in various applications. The geometry is trending down rapidly as user's demands increase on the performance and functionality. For example, a compressor with frequency conversion in the market is expected to be capable of reducing on-resistance, performing high speed switching and implementing with high breakdown voltage. In order to fulfill the requirements, the compressor needs to be equipped with several structures such as super junction.

The super junction structure is constructed by alternately arranging an n type impurity area and a p type impurity area constituting a p-n column pair. Usually, several processes, such as multiple etching, implanting and driving-in, are involved in constructing the p-n column pair. However, the implanted area is etched that shapes the impurity region into a jagged contour, which is unable to perform the function of the super junction. Thus, a structure or a method for forming the p-n column pair is still in great demand.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

A more complete understanding of the present disclosure may be derived by referring to the detailed description and claims when considered in connection with the Figures, where like reference numbers refer to similar elements throughout the Figures, and:

DETAILED DESCRIPTION OF THE INVENTION

Figure 1:
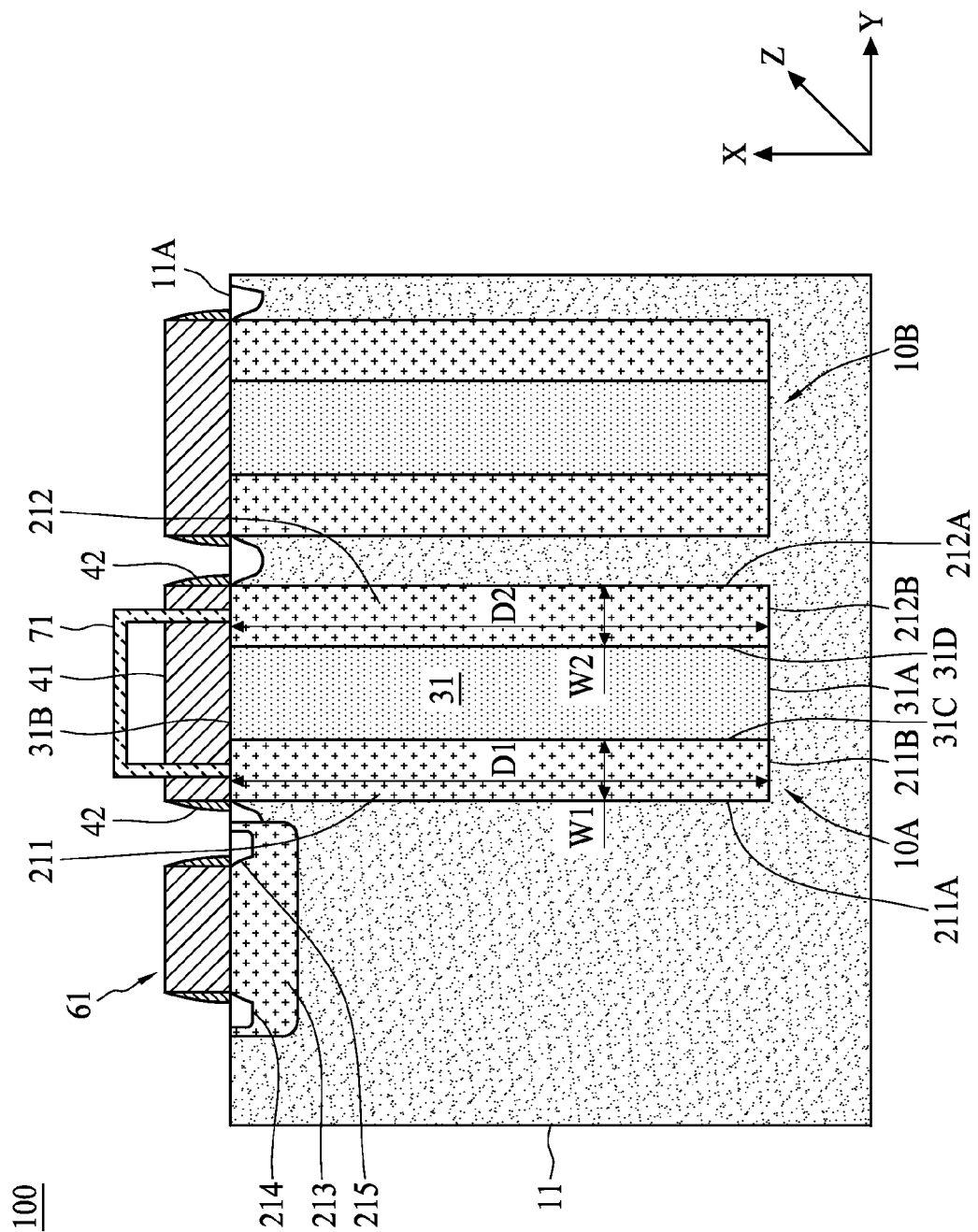
FIG. 1 is a cross sectional view of two EFD structures in a semiconductor structure according to some embodiments of the present disclosure.

The claimed subject matter is now described with reference to the drawings, wherein like reference numerals are generally used to refer to like elements throughout. In the following description, for purposes of explanation, numerous specific details are set forth in order to provide an understanding of the claimed subject matter. It is evident, however, that the claimed subject matter can be practiced without these specific details. In other instances, structures and devices are illustrated in block diagram form in order to facilitate describing the claimed subject matter.

In the present disclosure, since a single deep etching operation is substituted for the multiple etching operations and the multiple implanting operations are replaced by a pre-depositing operation, the dopant distribution in the impurity area is shaped like a strip. Thus, the electric field distribution between a semiconductor substrate and the strip is uniform and hence enhances the breakdown voltage of the semiconductor structure.

In various embodiments, an electric field distribution (EFD) structure is provided. The EFD structure includes, but not limited to, a string, a set of multiple strips, a set of multiple columns, a loop with a compound, which fills the vacancy surrounded by the loop, a set of multiple posts. The EFD structure is configured to distribute the electric field at a specific junction such as a p-n junction. Since the dopant in the EFD structure is prone to be diffused along a direction perpendicular to a depth of the semiconductor substrate, the doped location and the uniformity of the EFD structure is predicted or controlled.

DEFINITIONS

In describing and claiming the present disclosure, the following terminology will be used in accordance with the definitions set forth below.

As used herein, a "substrate" refers to a bulk substrate on which various layers and device structure are formed. In some embodiments, the bulk substrate includes silicon or a compound semiconductor, such as GaAs, InP, Si/Ge, or SiC. Examples of the layers include dielectric layers, doped layers, polysilicon layers or conductive layers. Examples of the device structures include transistors, resistors, and/or capacitors, which may be interconnected through an interconnect layer to additional integrated circuits. In some embodiments, the bulk substrate includes a wafer such as a polished wafer, an epi wafer, an argon anneal wafer, a hai wafer and a silicon on insulator (SOI) wafer.

As used herein, "deposition" refers to operations of depositing materials on a substrate using a vapor phase of a material to be deposited, a precursor of the material, an electrochemical reaction, or sputtering/reactive sputtering. Depositions using a vapor phase of a material include any operations such as, but not limited to, chemical vapor deposition (CVD) and physical vapor deposition (PVD). Examples of vapor deposition methods include hot filament CVD, rf-CVD, laser CVD (LCVD), conformal diamond coating operations, metal-organic CVD (MOCVD), thermal evaporation PVD, ionized metal PVD (IMPVD), electron beam PVD (EBPVD), reactive PVD, atomic layer deposition (ALD), plasma enhanced CVD (PECVD), high density plasma CVD (HDPCVD), low pressure CVD (LPCVD), and the like. Examples of deposition using electrochemical reaction include electroplating, electro-less plating, and the like. Other examples of deposition include pulse laser deposition (PLD), and atomic layer deposition (ALD).

As used herein, "metal oxide" refers to binary metal oxides, transition metal oxides, and lanthanide series metal oxides. The metal oxides described herein are often nonstoichiometric, thus a subscript "x" for the oxygen composition is used in the present disclosure. The metal oxide includes $MgO_x$, $AlO_x$, $TiO_x$, $CrO_x$, $MnO_x$ $FeO_x$, $CoO_x$, $NiO_x$, $CuO_x$, $ZnO_x$, $GeO_x$, $YO_x$, $ZrO_x$, $NbO_x$, $MoO_x$, $SnO_x$, $LaO_x$, $HfO_x$, $TaO_x$, $WO_x$, $CeO_x$, $GdO_x$, $YbO_x$, and $LuO_x$.

As used herein, a "mask layer" recited in the present disclosure is an object of a patterning operation. The patterning operation includes various steps and operations and varies in accordance with features of embodiments. In some embodiments, a patterning operation patterns an existing film or layer. The patterning operation includes forming a mask on the existing film or layer and removing the unmasked portion of the film or layer with an etch or other removal operation. The mask layer is a photo resist or a hardmask. In some embodiments, a patterning operation directly forms a patterned layer on a surface. The patterning operation includes forming a photosensitive film on the surface, conducting a photolithography operation and a developing operation. The remaining photosensitive film may be removed or retained and integrated into the package.

As used herein, an "electric-field distribution (EFD)" structure recited in the present disclosure refers to a capacitor-like structure with two low resistance layers sandwiching a high resistance layer. In some embodiments, the low resistance layers are non-metal such as polysilicon or doped silicon having a resistance lower than the resistance of the layer being sandwiched. In some embodiments, the high resistance layer is dielectric materials including foresaid metal oxides. In certain embodiments, the EFD structure is not limited to a vertical stack and hence a planar stack is used for a special configuration. At least two doped semiconductor-insulator interfaces are created in an EFD structure. In certain embodiments of the present disclosure, the contour of the interface includes at least one of a straight line, an arc, a tilt, or the like.

As used herein, a "spacer" recited in the present disclosure refers to structures surrounding a protrusion positioned on a surface and contacting the sidewall of said protrusion. The spacer is used to seclude the protrusion from the adjacent elements on the surface. In some embodiments, the protrusion is subsequently removed, leaving only the spacer on the surface. The spacer recited in the present disclosure is composed of insulating materials such as oxides, polymer, ceramics, or conductive materials such as Pt, AlCu, TiN, Au, Ti, Ta, TaN, W, WN, Cu, and the combinations thereof.

Referring to FIG. 1, a cross sectional view of two EFD structures 10A and 10B in a semiconductor structure 100, which is adopted in various applications, such as a compressor, is depicted. In some embodiments, EFD structure 10A is identical to EFD structure 10B, and hence the following description is directed to the EFD structure 10A. In the present disclosure, a longitudinal direction is a direction along X axis, and a transversal direction is a direction perpendicular to the X axis. In other words, the transversal direction is parallel to Y axis. A dielectric 31 is disposed in the semiconductor substrate 11 and along X axis. First and second doped regions 211, 212 are disposed in the semiconductor substrate 11 with a depth along the longitudinal direction. A third doped region 213 is a well region in the semiconductor substrate 11. In addition, a cover 41 is on the semiconductor substrate 11. Two spacers 42 are attached to the cover 41. An active component 61, such as a metal oxide semiconductor (MOS), is on the semiconductor substrate 11 and configured as a transistor.

In some embodiments, the semiconductor substrate 11 encompasses most of elements in the semiconductor structure 100. The semiconductor substrate 11 surrounds a side wall 211A and a bottom surface 211B of the first doped region 211. Since the first doped region 211 and the second doped region 212 are symmetrical with reference to the dielectric 31, the semiconductor substrate 11 also surrounds a side wall 212A and a bottom surface 212B of the second doped region 212. In addition, the semiconductor substrate 11 is under bottom surface 31A of the dielectric 31. The third doped region 213 is spaced from the first doped region 211 with a predetermined distance. In some embodiments, the distance is between about 1 µm and about 10 µm. In certain embodiments, the distance is between about 0.5 µm and about 7.8 µm. In other embodiments, the distance is between about 1.7 µm and about 6.9 µm. In some other embodiments, the distance is between about 3.3 µm and about 4.6 µm. The foresaid distance is designed according to location of the EFD structure 10A.

The electric conductivity type of the semiconductor substrate 11 is opposite to the electric conductivity types of the first doped region 211, the second doped region 212 and the third doped region 213. In some embodiments, the electric conductivity type of the semiconductor substrate 11 is n type, while the first doped region 211, the second doped region 212 and the third doped region 213 are p conductivity type semiconductors.

Shape of the first doped region 211 is in various types. In some embodiments, the first doped region 211 follows contour of a portion of the dielectric 31. In some embodiments, the first doped region 211 is in a columnar, strip, or staggered shape.

The dopant of the first doped region 211 is distributed along the transversal direction (Y axis). Particularly, the first doped region 211 has a greater dopant concentration at location close to the dielectric 31 than the dopant concentration at location close to the semiconductor substrate 11. In some embodiments, the dopant concentration in the first doped region 211 is in a gradient with a maximum value at interface between first doped region 211 and dielectric 31 and a minimum value at interface between first doped region 211 and substrate 11. Along the longitudinal direction (X axis), the dopant concentration is substantially uniform. In some embodiments, the dopant concentration uniformity along the depth (X axis) of the first doped region 211 is within 0.2%. Thus, the first doped region 211 shapes like a strip.

In some embodiments, the first doped region 211 has a first depth D1 and a first width W1. In some embodiments, the first depth D1 is greater than about 15 µm. In certain embodiments, the first depth D1 is between about 16 µm and 300 µm. In other embodiments, the first depth D1 is between about 23.5 µm and about 150 µm. In some other embodiments, the first depth D1 is between about 37.7 µm and about 190.6 µm. In some embodiments, since the first width W1 is between about 1 µm and about 5 µm, the aspect ratio (depth divided by width) of the first doped region 211 is between about 30:1 to about 10:1. In certain embodiments, the aspect ratio of the first doped region 211 is between about 300:1 to about 3:1. In some other embodiments, the aspect ratio of the first doped region 211 is between about 38.1:1 to about 23.5:1. In other words, the aspect ratio of the first doped region 211 in the semiconductor substrate 11 is greater than about 10.

The first doped region 211 is sandwiched between the semiconductor substrate 11 and dielectric 31 along Y axis. A junction between the first doped region 211 and the semiconductor substrate 11 extends along Z-axis, which is perpendicular to X and Y axis. The electric field is evenly distributed around the junction.

In some embodiments as in FIG. 1, the first doped region 211 and the second doped region 212 are symmetrical with reference to the dielectric 31. The second doped region 212 has same depths and widths with the first doped region 211. For dopant concentration along Y axis, the second doped region 212 has a greater dopant concentration at location close to the dielectric 31 than the dopant concentration at location close to the semiconductor substrate 11. In some embodiments, the dopant concentration in the second doped region 212 is in a gradient with a maximum value at interface between second doped region 212 and dielectric 31 and a minimum value at interface between second doped region 212 and semiconductor substrate 11. The dopant concentration along X axis is substantially uniform and in some embodiments, the dopant concentration uniformity along the depth of the second doped region 212 is within 0.2%.

In some embodiments, the material of the dielectric 31 is selected from oxide, metal oxide, nitride, phosphosilicate glass (PSG), tetra-ethyl-ortho-silicate (TEOS) oxide, Black Diamond® (Applied Materials of Santa Clara, Calif.), amorphous fluorinated carbon, low-k dielectric materials and borophosphosilicate Glass (BPSG). Examples of the oxide are selected from silicon dioxide ($SiO_2$) and phosphorus pentoxide ($P_4O_{10}$), selenium dioxide ($SeO_2$), sulfur trioxide ($SO_3$). Examples of the metal oxide are selected from zinc oxide (ZnO), aluminium oxide ($Al_2O_3$), iron(II,III) oxide ($Fe_3O_4$), calcium oxide (CaO), ruthenium tetroxide ($RuO_4$), osmium(VIII) oxide ($OsO_4$), iridium tetroxide ($IrO_4$), indium tin oxide ($In_2O_3$:$SnO_2$), xenon tetroxide ($XeO_4$), nickel oxide, titanium oxide, hafnium oxide, zirconium oxide, tungsten oxide, tantalum oxide, molybdenum oxide and copper oxide. Examples of the nitride are selected from silicon nitride ($Si_3N_4$), titanium nitride (TiN), silicon oxynitride ($Si_2N_2O$), thallium(I) nitride ($Tl_3N$), magnesium nitride ($Mg_3N_2$), beryllium nitride ($Be_3N_2$), calcium nitride ($Ca_3N_2$) and strontium nitride ($Sr_3N_2$).

In some embodiments as in FIG. 1, the cover 41 is over the top surface 31B of the dielectric 31. In other words, the dielectric 31 is between the cover 41 and the semiconductor substrate 11 along longitudinal direction. The cover 41 is used to protect the dielectric 31 from being etched. In some embodiments, the cover 41 is designed to extend along the Z axis along with the dielectric 31.

In some embodiments, the material of the cover 41 is designed to have a highly selective etching rate between the cover 41 and the dielectric 31. Thus, the material of the cover 41 is distinguishable from the material of the dielectric 31 and selected from the oxide, metal oxide, nitride, metal, polysilicon, and silicide. Examples of the oxide are selected from silicon dioxide ($SiO_2$) and phosphorus pentoxide ($P_4O_{10}$), selenium dioxide ($SeO_2$), sulfur trioxide ($SO_3$). Examples of the metal oxide are selected from zinc oxide (ZnO), aluminium oxide ($Al_2O_3$), iron(II,III) oxide ($Fe_3O_4$), calcium oxide (CaO), ruthenium tetroxide ($RuO_4$), osmium (VIII) oxide ($OsO_4$), iridium tetroxide ($IrO_4$), indium tin oxide ($In_2O_3$:$SnO_2$), xenon tetroxide ($XeO_4$), nickel oxide, titanium oxide, hafnium oxide, zirconium oxide, tungsten oxide, tantalum oxide, molybdenum oxide and copper oxide. Examples of the nitride are selected from silicon nitride ($Si_3N_4$), titanium nitride (TiN), silicon oxynitride ($Si_2N_2O$), thallium(I) nitride ($Tl_3N$), magnesium nitride ($Mg_3N_2$), beryllium nitride ($Be_3N_2$), calcium nitride ($Ca_3N_2$) and strontium nitride ($Sr_3N_2$). Examples of the metal are selected from Aluminum (Al), Chromium (Cr), Gold (Au), Molybdenum (Mo), Platinum (Pt), Tantalum (Ta), Titanium (Ti), Copper (Cu) and Tungsten (W).

In some embodiments as in FIG. 1, an interconnect 71 external to the semiconductor substrate 11 is electrically connected with the first doped region 211 and the second doped region 212. Since the first doped region 211 and second doped region 212 are electrically connected through the interconnect 71, the p-n junction at opposite side with reference to the dielectric 31 are able to evenly distribute the electric field. In some embodiments, the interconnect 71 is through the cover 41. An electric voltage is easily applied to the EFD structure 10A through the interconnect 71. In other embodiments, the interconnect 71 is an electric trace in the cover 41.

In some embodiments, spacers 42 are at sidewalls of the cover 41 and an active component 61 is disposed on the third doped region 213, which has two doped areas 214, 215. The active component 61 includes a gate electrode and a gate oxide layer is between the third doped region 213 and the gate electrode. In some embodiments, the active component 61 and the third doped region 213 is integrated as a transistor. In some embodiments, the electric conductivity type of the third doped region 213 is p type, while the doped areas 214, 215 are n type semiconductors.

In some embodiments, the transistor is turned on by applying a predetermined positive voltage. When the transistor is turned on, an inversion layer is formed in the third doped region 213 and under the gate oxide layer. Electrons flow through this inversion layer between the source and the drain. At a reverse bias applying state (in a state in which the source voltage is set to the ground electric potential and the drain voltage is set to the positive electric potential), a depletion layer is spread from p-n junction either between the first doped region 211 and the semiconductor substrate 11 or between the second doped region 212 and the semiconductor substrate 11. The first doped region 211 and second doped region 212 are depleted to sustain high breakdown voltage.

Figure 2:
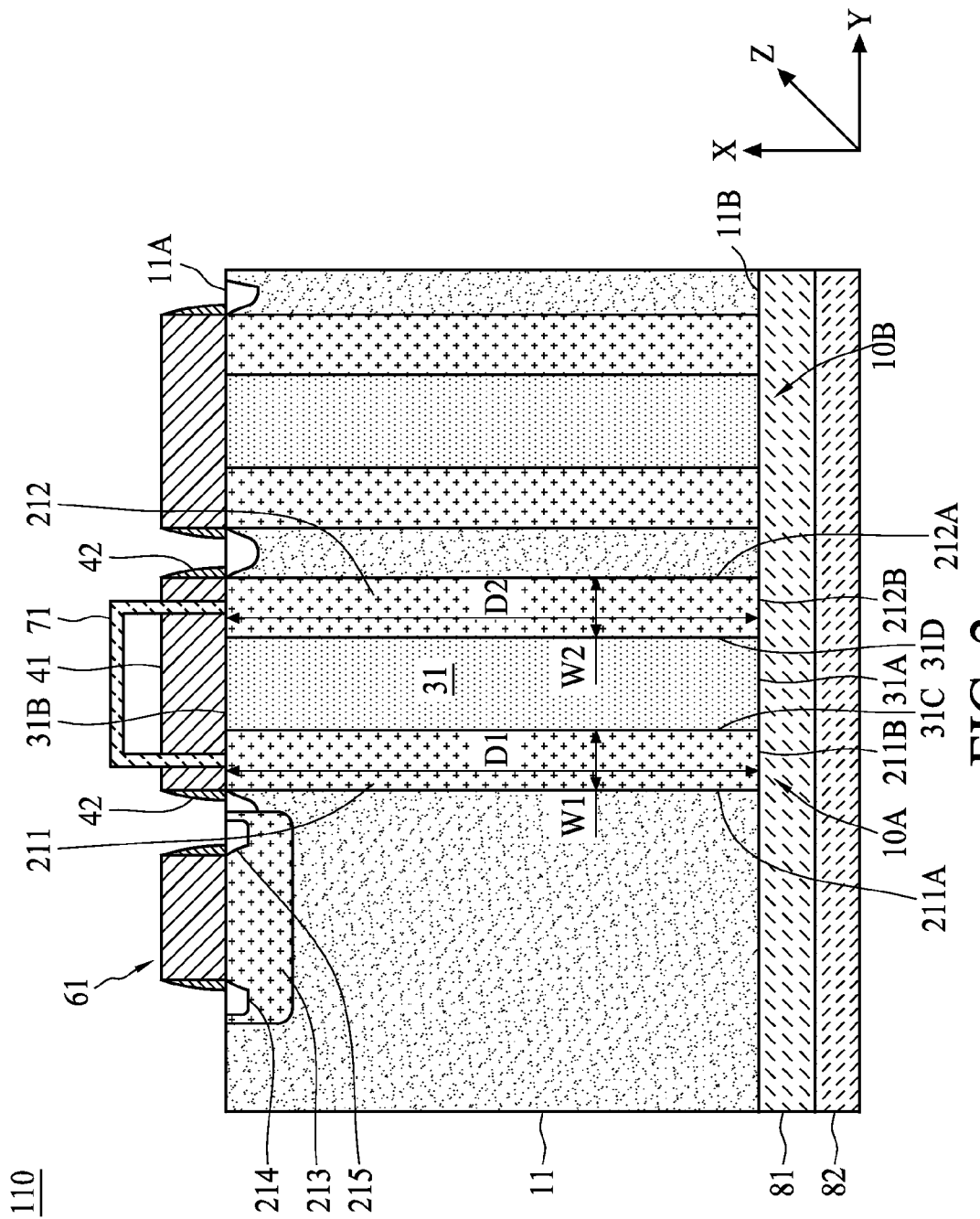
FIG. 2 is a cross sectional view of an epitaxial layer and a conductive layer under a semiconductor substrate according to some embodiments of the present disclosure.

Referring to FIG. 2, a semiconductor structure 110 is provided. Elements with same labeling numbers as those in FIG. 1 are previously discussed with reference thereto and are not repeated here for simplicity. In FIG. 2, the semiconductor structure 110 further includes an epitaxial layer 81 and a conductive layer 82 positioned under the semiconductor substrate 11.

In some embodiments, EFD structure 10A is identical to EFD structure 10B, and hence the following description is directed to the EFD structure 10A, which includes the first doped region 211, the dielectric 31 and the second doped region 212. Since EFD structure 10A penetrates through the semiconductor substrate 11, the bottom surfaces 211B, 212B and 31A are in contact with the epitaxial layer 81.

The electric conductivity type of the epitaxial layer 81 is opposite to electric conductivity types of the first doped region 211, the second doped region 212 and the third doped region 213. In some embodiments, the electric conductivity type of the epitaxial layer 81 is n type, while the first doped region 211, the second doped region 212 and the third doped region 213 are p conductivity type semiconductors. In some embodiments, bias is applied to the epitaxial layer 81 so as to remove accumulated charges around the p-n junction of the EFD structure 10A.

The conductive layer 82 is under the bottom surface 11B of the semiconductor substrate 11. Particularly, the conductive layer 82 is placed under the epitaxial layer 81. In some embodiments, a conductive layer 82 is in direct contact with bottom surface 11B of semiconductor substrate 11 without interposing an epitaxial layer there between. The material of the conductive layer 82 includes Aluminum (Al), Chromium (Cr), Gold (Au), Molybdenum (Mo), Platinum (Pt), Tantalum (Ta), Titanium (Ti), Copper (Cu) or Tungsten (W). Other materials are within the contemplated scope of present disclosure.

In some embodiments, the junction between the conductive layer 82 and the epitaxial layer 81 is, but not limited to, a Schottky barrier; hence, the junction is selected from a Schottky barrier, an ohmic contact, a tunnel junction and a heterojunction. Since the electron of the epitaxial layer 81 flows to the conductive layer 82 through the Schottky barrier, the accumulated charges around the p-n junction of the EFD structure 10A is removed. In other embodiments, the bias removing the accumulated charges is applied to the conductive layer 82 for removal of the accumulated charges.

Figure 3:
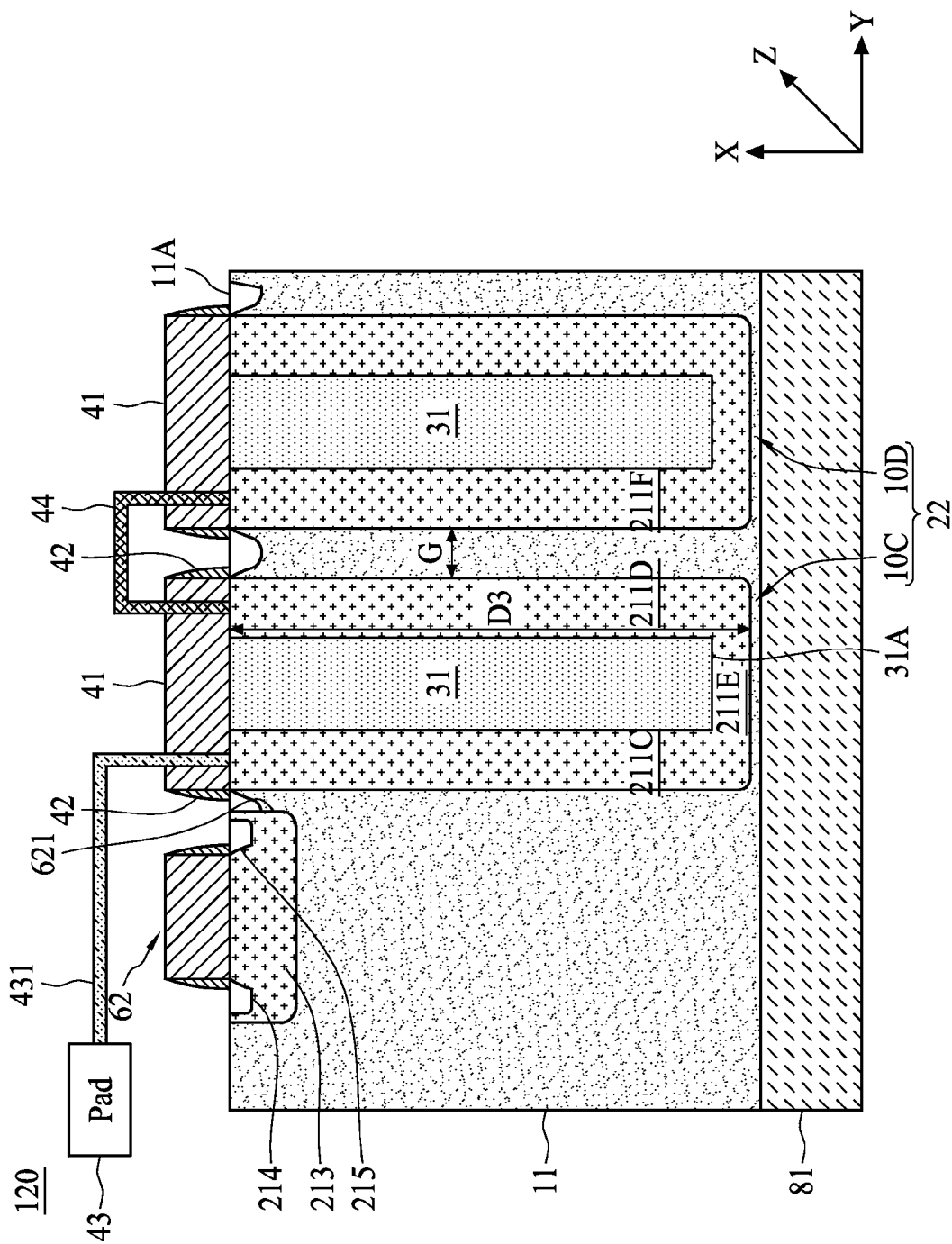
FIG. 3 is a cross sectional view of another semiconductor structure with a pad according to some embodiments of the present disclosure.

Referring to FIG. 3, a semiconductor structure 120 is provided. Elements with same labeling numbers as those in FIG. 2 are previously discussed with reference thereto and are not repeated here for simplicity. In some embodiments, the semiconductor structure 120 includes a transistor 62 and a p-n junction string 22, which has several EFD structures such as 10C, 10D and other EFD structures. In some embodiments, structures of the two adjacent EFD structures 10C and 10D are identical, and hence the following description is directed to the EFD structure 10C. A pad 43 is over the semiconductor substrate 11.

In some embodiments, the p-n junction string 22 is electrically coupled to the transistor 62 at one end 621 and the p-n junction string 22 is spaced from the transistor 62 with a predetermined distance. In some embodiments, the distance is between about 1 μm and about 10 μm. In certain embodiments, the distance is between about 0.5 μm and about 7.8 μm. In other embodiments, the distance is between about 1.7 μm and about 6.9 μm. In some other embodiments, the distance is between about 3.3 μm and about 4.6 μm. The foresaid distance is short enough to miniaturize the semiconductor structure 120 and long enough to prevent permanent break down from happening.

In some embodiments, in p-n junction string 22, a predetermined gap G is between adjacent EFD structures 10C and 10D. In some embodiments, the gap G is between about 2 μm and about 20 μm. In certain embodiments, the gap G is between about 0.5 μm and about 22.8 μm. In other embodiments, the gap G is between about 1.7 μm and about 13.1 μm. In some other embodiments, the gap G is between about 5.3 μm and about 17.6 μm. The gap G is able to increase the contacting area of the p-n junction for evenly distributing the electric field therein.

In some embodiments, a doped strip 211C is a portion of the EFD structure 10C and forms a p-n junction with the semiconductor substrate 11. The doped strip 211C is similar with the first doped region 211, which is previously discussed with reference in FIGS. 1 and 2 and is not repeated here for simplicity. In FIG. 3, the EFD structure 10C further includes a doped strip 211D and a coupling region 211E. The doped strip 211D is similar with the second doped region 212, which is previously discussed with reference in FIGS. 1 and 2 and is not repeated here for simplicity.

In some embodiments, the doped strip 211D and the doped strip 211C have same aspect ratio. In some embodiments, the aspect ratio of the doped strip 211C or the doped strip 211D is between about 40:1 to about 10:1. In certain embodiments, the aspect ratio of the doped strip 211C or the doped strip 211D is between about 310:1 to about 11:1. In some other embodiments, the aspect ratio of the doped strip 211C or the doped strip 211D is between about 138.1:1 to about 17.5:1. In other words, the aspect ratio of the doped strip 211C or the doped strip 211D in the semiconductor substrate 11 is greater than about 10. In some embodiments, the dopant concentration uniformity along X axis of the doped strip 211C and doped strip 211D is within 0.2%.

In some embodiments, in order to prevent simultaneously depleting the p-n junction, the gradient of dopant distribution in the doped strip 211D is greater or smaller than the gradient of dopant distribution of the doped strip 211C. Since the different impurity gradient, a spread speed of the depletion layer is different (the spread speed is fast as concentration is low, while the spread speed is slow as concentration is high). Therefore, timing for perfectly depleting the p-n junctions is shifted along Y axis, and it is prevented that all p-n junctions are simultaneously turned off. As its result, a changing ratio with respect to an electric current between the drain and the source at a switching time from an on-state to an off-state is reduced, and jumping-up of a voltage between the drain and the source at the switching time from an on-state to an off-state is deferred.

In some embodiments, the electric conductivity types of the coupling region 211E, the doped strip 211C and the doped strip 211D are opposite to the electric conductivity type of the semiconductor substrate 11. The p-n junction between the doped strip 211C and the semiconductor substrate 11 and the p-n junction between the doped strip 211D and the semiconductor substrate 11 are electrically connected through the p-n junction between the coupling region 211E and the semiconductor substrate 11. Thus, the coupling region 211E is used to distribute the electric field more evenly in those p-n junctions.

In some embodiments, a pad 43 is electrically coupled to the p-n junction string 22, which is designed to sustain a high breakdown voltage. The pad 43 is configured to receive a voltage greater than 100 V. In some embodiments, the voltage is between about 115 V and about 2000 V. In certain embodiments, the voltage is between about 309 V and about 2500 V. In other embodiments, the voltage is between about 210 V and about 800 V. In some other embodiments, the voltage is between about 610 V and about 1800 V.

In some embodiments, an electric line 431 is electrically connected the pad 43 and the doped strip 211C. In some embodiments, the electric line 431 penetrates through the cover 41. The voltage applied to the p-n junction string 22 is through the electric line 431. In certain embodiments, the electric line 431 is electrically connected to the transistor 62 and hence the foresaid voltage is applied to the transistor 62 through the electric line 431.

A conductive line 44 electrically connects the EFD structure 10C and the EFD structure 10D. The conductive line 44 is disposed over the semiconductor substrate 11. In some embodiments, conductive line 44 is disposed on the top surface 11A of the semiconductor substrate 11. The conductive line 44 allows the electric field to evenly distribute in the p-n junction string 22.

Figure 4:
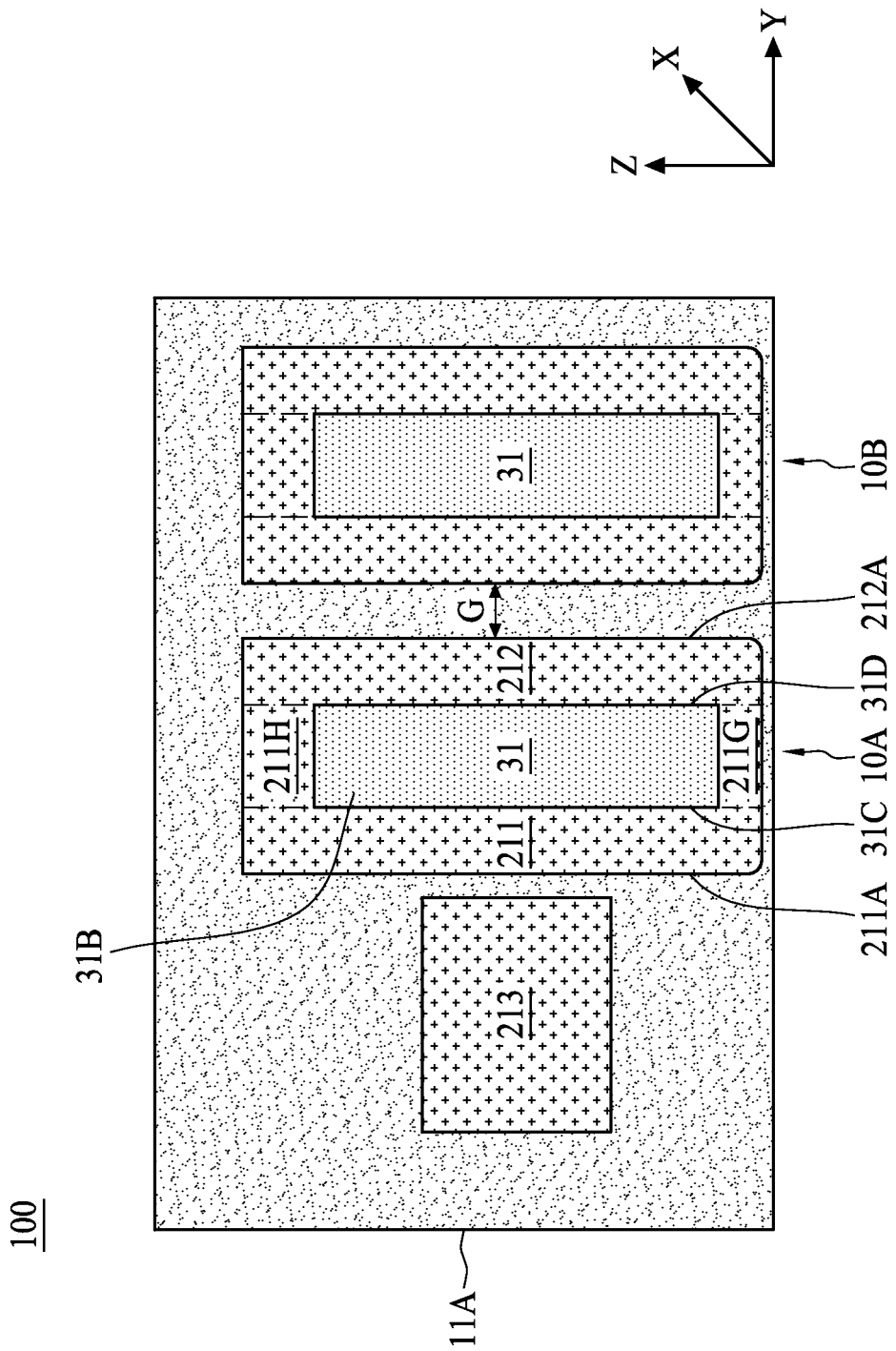
FIG. 4 is a top view of two EFD structures in a semiconductor structure according to some embodiments of the present disclosure.

FIG. 4 is a top view of a portion of the semiconductor structure 100 in FIG. 1, and elements with same labeling numbers as those in FIG. 1 are previously discussed with reference thereto and are not repeated here for simplicity. In FIG. 4, the semiconductor structure 100 includes two EFD structures 10A, 10B that are separated by a gap G. Cover 41, spacers 42, interconnect 71 and active component 61 are ignored to show the connecting regions 211G, 211H, the dielectric 31 and the top surface 11A. The EFD structure 10A includes a loop formed by the first doped region 211, the second doped region 212 and the connecting regions 211G, 211H. The dielectric 31 is located inside the loop.

In some embodiments, the connecting regions 211G and 211H extends along X axis. In some embodiments, the electric conductivity type of the loop is p type while the electric conductivity type of the semiconductor substrate 11 is n type. Interface between the loop and the semiconductor substrate is a continuous p-n junction.

Figure 5:
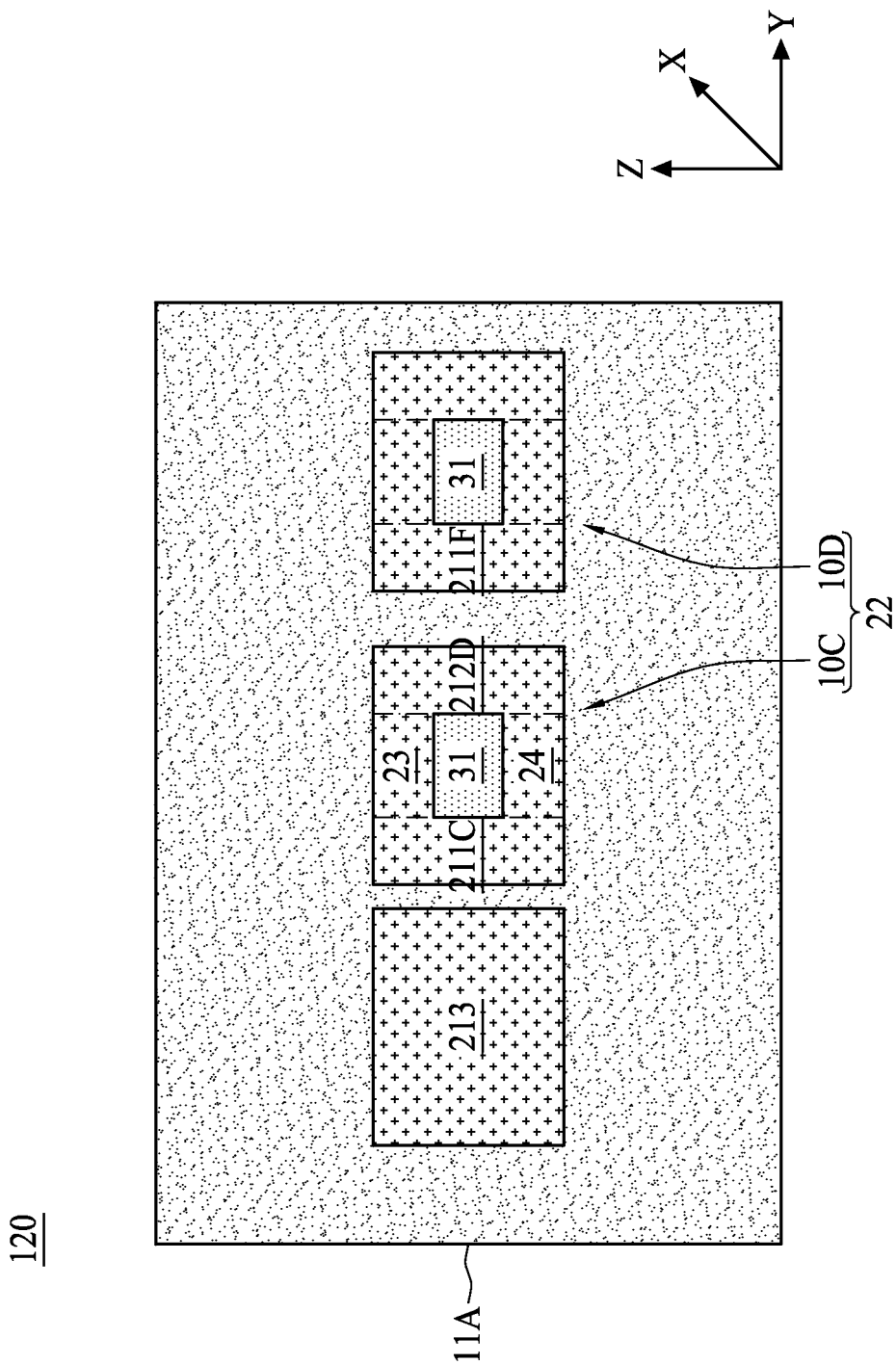
FIG. 5 is a top view of other EFD structures in a semiconductor structure according to some embodiments of the present disclosure.

FIG. 5 is a top view of a portion of the semiconductor structure 120 in FIG. 3, elements with same labeling numbers as those in FIG. 3 are previously discussed with reference thereto and are not repeated here for simplicity. Referring to FIG. 5, a semiconductor structure 120 includes two EFD structures 10C, 10D and a third doped region 213.

In some embodiments as in FIG. 5, the two EFD structures 10C, 10D are symmetric and hence the following description is directed to EFD structure 10C. The EFD structure 10C includes a loop formed by doped strips 211C, 211D and connecting regions 23 and 24.

In some embodiments, the connecting regions 23 and 24 have the same electric conductivity types as well as the doped strip 211C and the doped strip 211D. In certain embodiments, the loop is p type while the electric conductivity type of the semiconductor substrate is n type. Interface between the loop and the semiconductor substrate is a continuous p-n junction.

A method for fabricating a semiconductor structure, which is similar a super junction string, is designed for obtaining the high breakdown voltage. The method includes a number of operations and the description and illustration are not deemed as a limitation as the order of the operations.

A term "providing" or "provided" is used in the present disclosure to describe an operation of locating an object to a specific site such as a chuck. The providing operation includes various steps and processes and varies in accordance with the features of embodiments. In some embodiments, a providing operation includes holding a semiconductor substrate or a wafer for further spinning motion. In certain embodiments, a providing operation includes spinning a semiconductor substrate or a wafer in a vacuum condition.

A term "forming" or "formed" is used in the present disclosure to describe an operation of applying a chemical material or an external force on an object. The forming operation includes various steps and processes and varies in accordance with the features of embodiments. In some embodiments, the forming operation is a deposition operation, which deposits a dielectric layer on the object. In other embodiments, the forming operation is an oxidizing operation in a furnace where the object is oxidized. In certain embodiments, the forming operation is an etching operation, which vertically remove a portion of the object by the external force.

A term "inserting" or "inserted" is used in the present disclosure to describe an operation of incorporating an impurity into an object. The inserting operation includes various steps and processes and varies in accordance with the features of embodiments. In certain embodiments, the inserting operation includes ion-implanting the dopants in to the object. In some embodiments, the inserting operation includes pre-depositing the dopants into the object. For instance, the pre-deposition uses boron-based gas, such as $B_2H_6$, $BCl_3$, within a temperature from about 1000 to about 1200° C., within about 200 to about 400 sec (about 50 to about 100 CC) for forming a P well or a p-n junction string formation in an n type semiconductor substrate. In some embodiments, the pre-deposition uses phosphorus-based gas, such as $PH_3$, $POCl_3$, within a temperature from about 1000 to about 1200° C., within about 200 to about 400 sec (about 50 to about 100 CC) for forming a N well or a p-n junction string formation in a p type semiconductor substrate. In the present disclosure, a high and low temperature are traded off for a short duration and a long duration for the operation, respectively.

A term "filling" or "filled" is used in the present disclosure to describe an operation of placing a material into a vacancy. The filling operation includes various steps and processes and varies in accordance with the features of embodiments. In some embodiments, the filling operation includes depositing the dielectric into a trench as an isolation structure. In certain embodiments, the filling operation includes epitaxially growing the dielectric in the trench.

A term "driving" or "driven" is used in the present disclosure to describe an operation of diffusing a material toward a distance. The driving operation includes various steps and processes and varies in accordance with the features of embodiments. In certain embodiments, the driving operation includes implanting dopants into a substrate in the distance. In some embodiments, the driving operation includes diffusing the impurity into a substrate. For instance, the driving operation is operated in a temperature from about 1000 to about 1200° C., within about 100 to about 300 mins. In the present disclosure, a high and low temperature are traded off for a short duration and a long duration for the operation, respectively.

Figure 6:
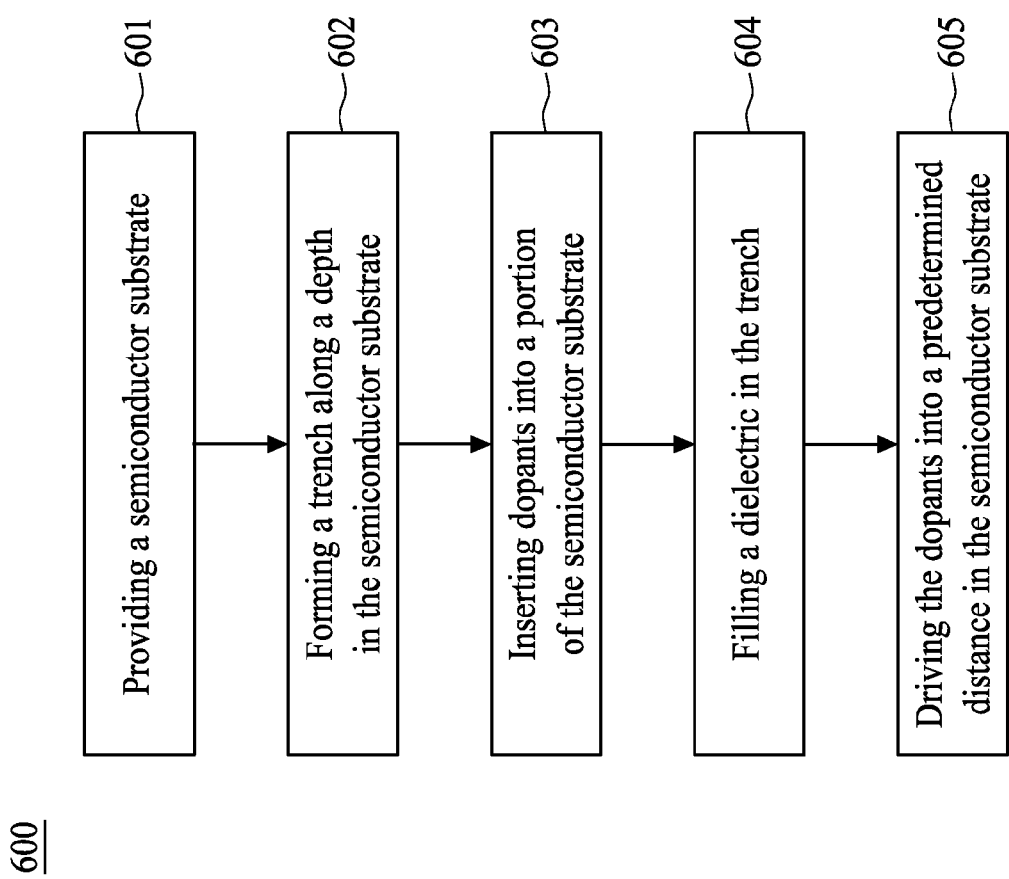
FIG. 6 is a flowchart of method in fabricating a semiconductor structure according to some embodiments of the present disclosure.

FIG. 6 is a diagram of a method 600 for fabricating a semiconductor structure in accordance with some embodiments of the present disclosure. The method 600 includes several operations, which are discussed in detail with reference to FIGS. 7 to 19. At operation 601, a semiconductor substrate is provided. At operation 602, a trench is formed along a depth in the semiconductor substrate. At operation 603, dopants are inserted into a portion of the semiconductor substrate. At operation 604, a dielectric is filled in the trench. At operation 605, dopants are driven into a predetermined distance in the semiconductor substrate.

FIGS. 7 to 19 have been simplified for a better understanding of the inventive concepts of the present disclosure. In FIGS. 7 to 19, elements with same labeling numbers as those in FIG. 1 to FIG. 5 are previously discussed with reference thereto and are not repeated here for simplicity.

Figure 7:
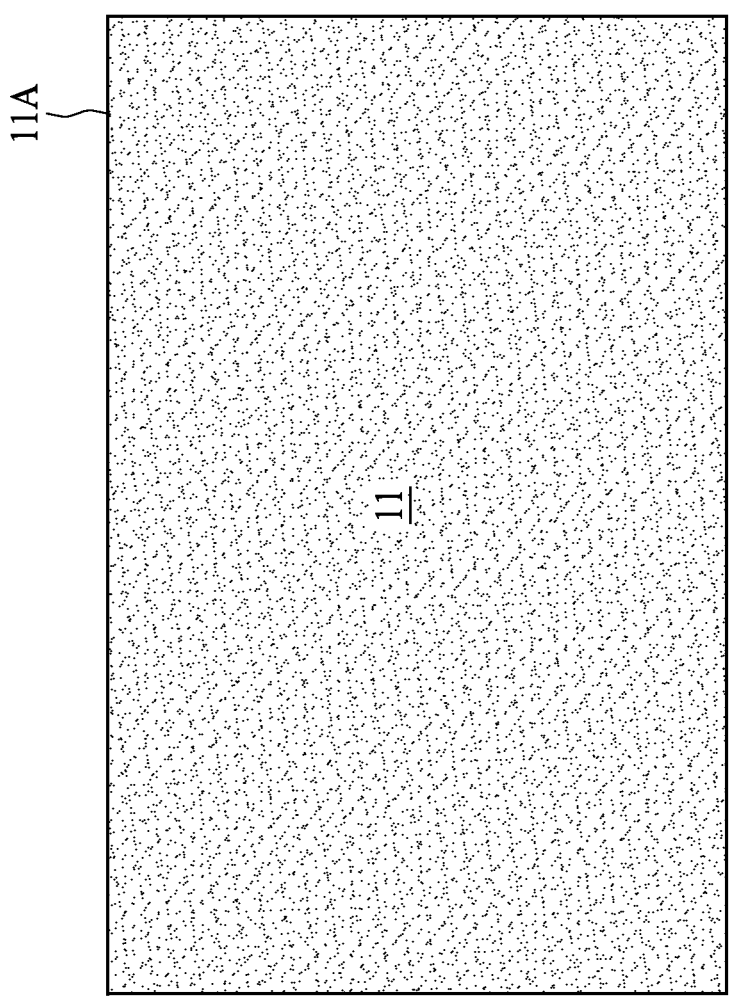
FIGS. 7 to 19 are cross sectional views corresponding to various operations 601 to 605 in FIG. 6.
Figure 8:
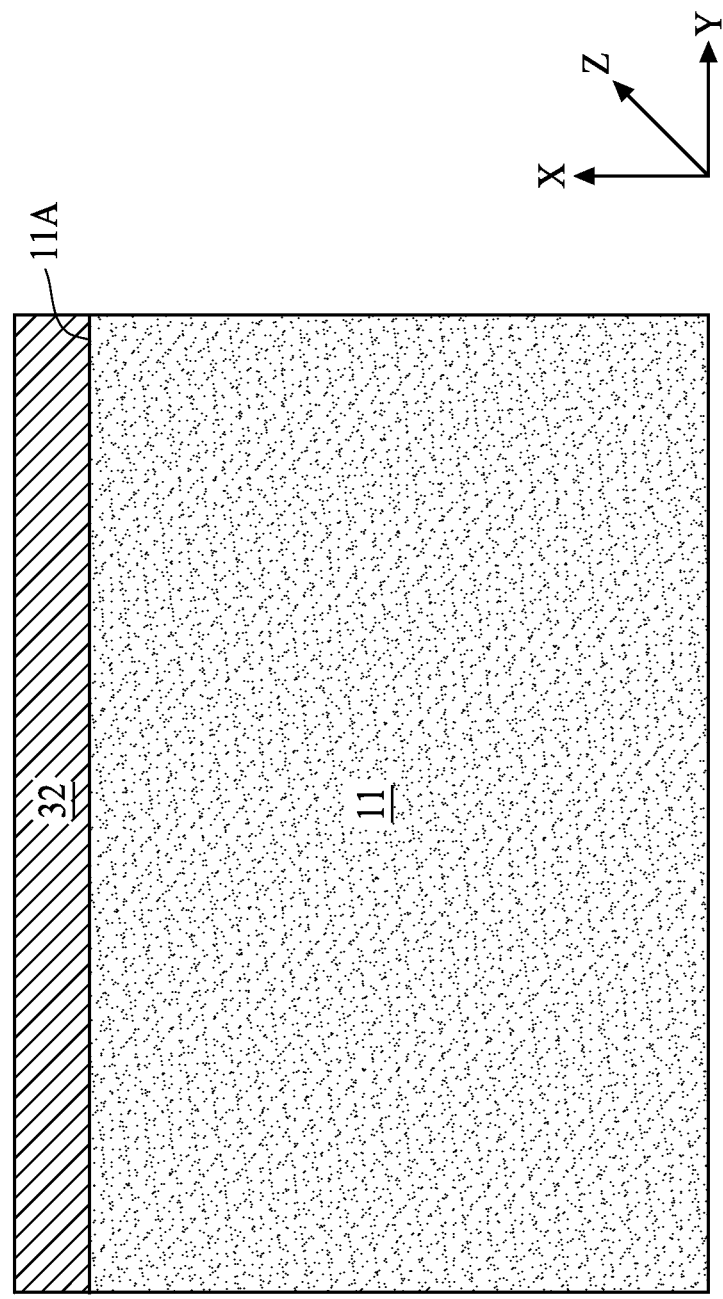
Figure 9:
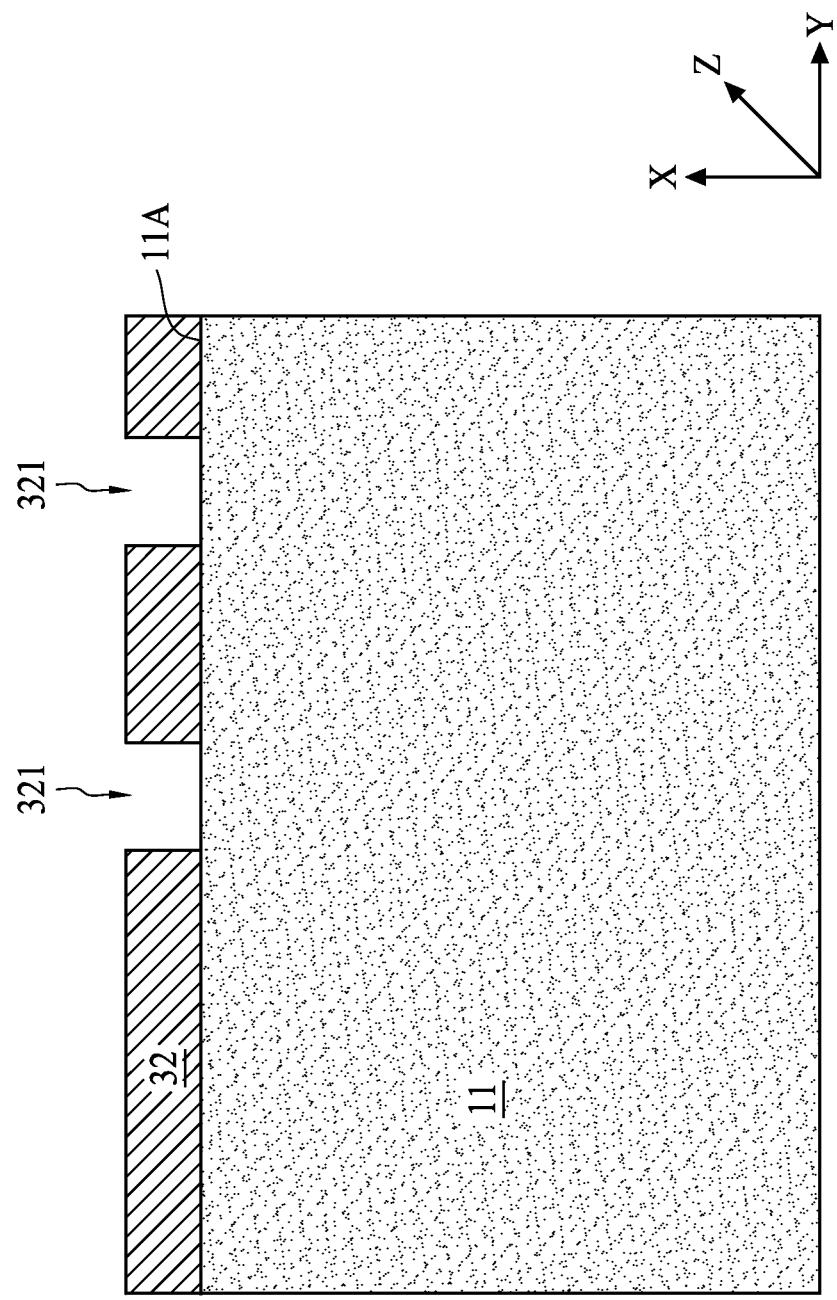
Figure 10:
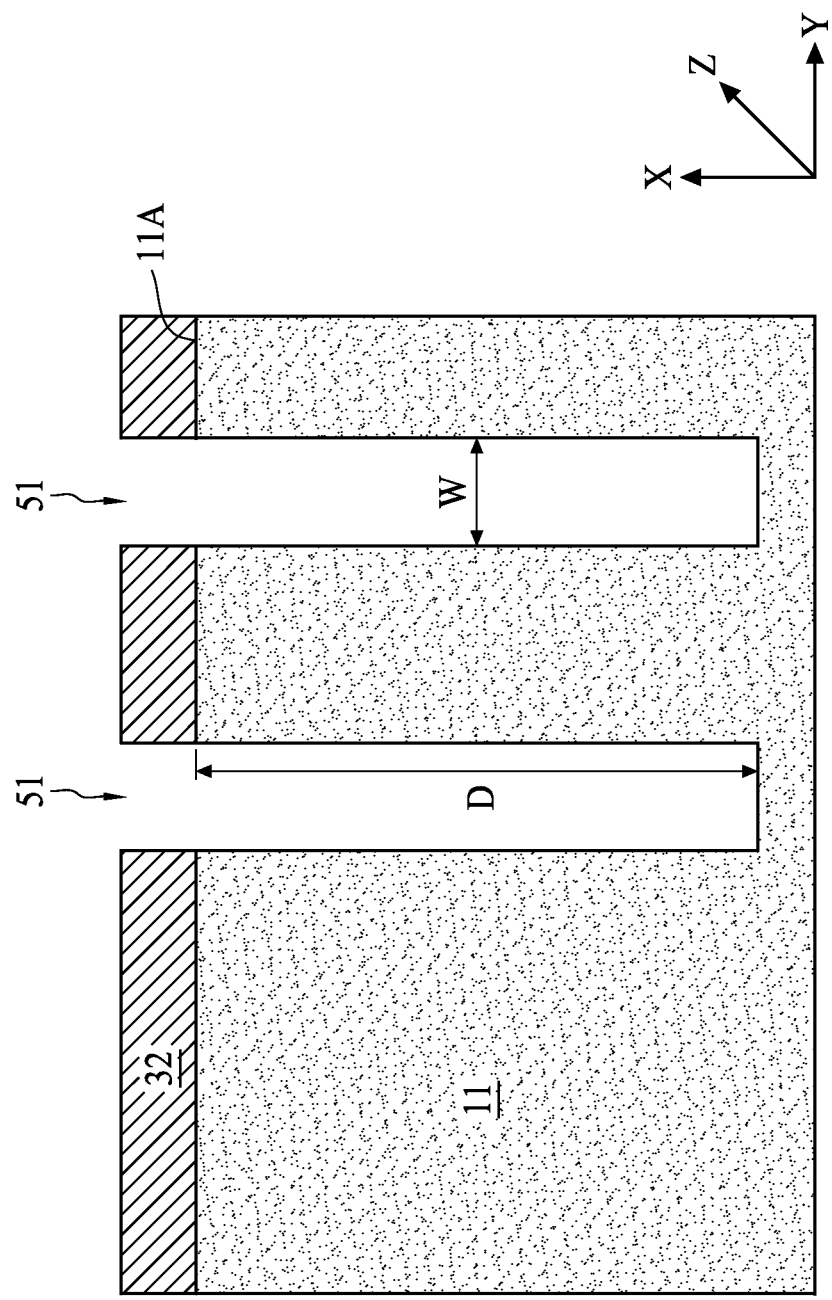

Referring to FIG. 7, the semiconductor substrate 11 is provided at a location, such as a chuck. A mask layer 32 is formed on the top surface 11A of the semiconductor substrate 11 as shown in FIG. 8. The material of the mask layer 32 is selected from the previously discussed oxide and nitride. A portion of the mask layer 32 is remove and then two openings 321 are formed therein and exposing the top surface 11A as shown in FIG. 9. Trenches 51 are formed as in FIG. 10, location of the trench 51 follows footprint of opening 321 in FIG. 9.

In some embodiments, trenches 51 are formed through DRIE etching method (Semiconductor And Telecommunications Co., Ltd.). In some embodiments, the width W of trench 51 is between about 2 µm and about 30 µm. In certain embodiments, the width W is between about 4.3 µm and about 70 µm. In other embodiments, the width W is between about 1.7 µm and about 11 µm. In some other embodiments, the width W is between about 0.5 µm and about 5.6 µm.

In some embodiments the depth D of trench 51 is greater than about 15 µm. In certain embodiments, the depth D is between about 18 µm and 330 µm. In other embodiments, the depth D is between about 27.5 µm and about 180 µm. In some other embodiments, the depth D is between about 87.7 µm and about 130.6 µm. In some embodiments, the depth D is deep enough to fail to ion-implant impurity into a portion 52 of the semiconductor substrate 11 surrounding the trench 51 and short enough to use gas doping method to insert dopants into the portion 52 of the semiconductor substrate 11.

According to some embodiments in the present disclosure, the aspect ratio of trench 51 is between about 45:1 to about 21:1. In certain embodiments, the aspect ratio of the trench 51 is between about 145:1 to about 15:1. In some other embodiments, the aspect ratio of the trench 51 is between about 210:1 to about 12:1. In other words, the aspect ratio of the trench 51 in the semiconductor substrate 11 is greater than about 10.

Figure 11:
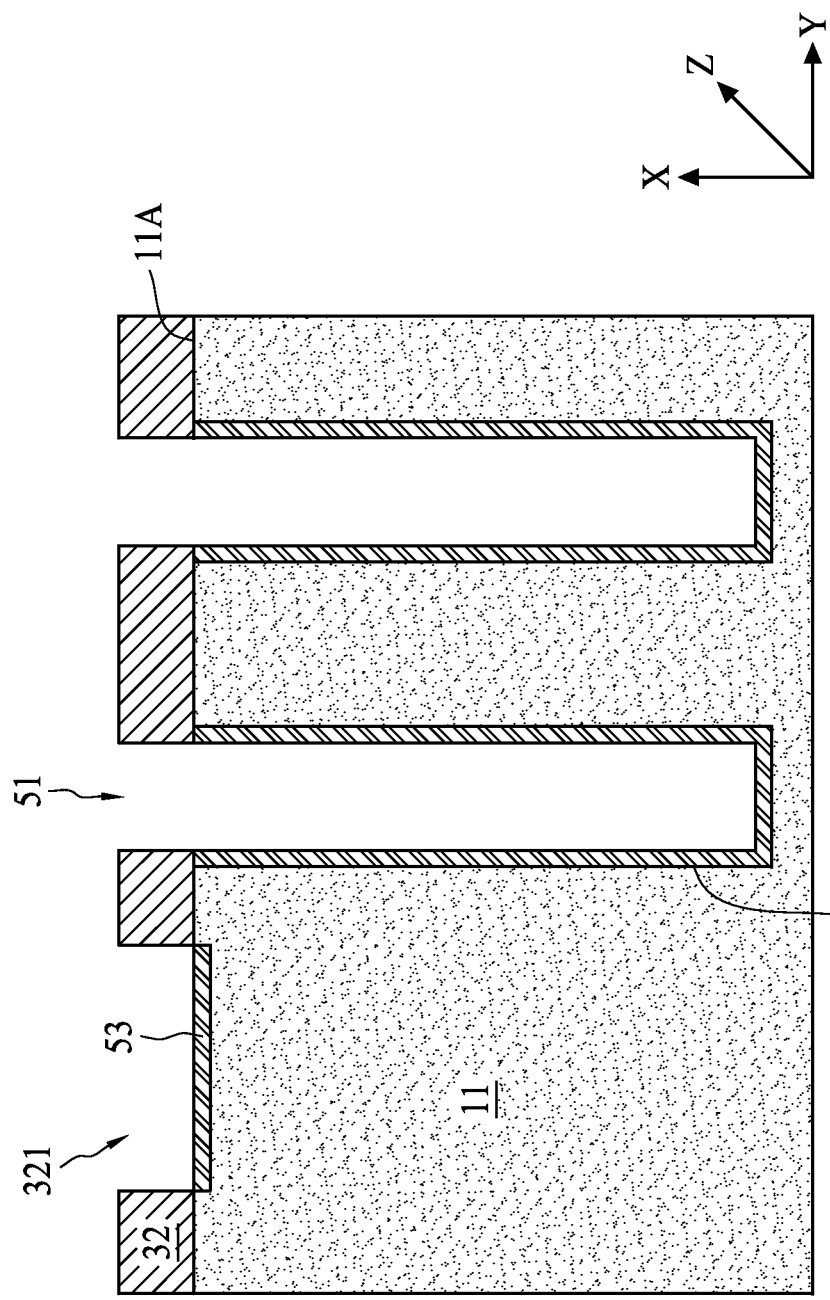

FIG. 11 is a illustration showing dopant insertion into a portion 52 of the semiconductor substrate 11. The portion 52 of the semiconductor substrate 11 surrounds the trench 51. An opening 321 is also designed to simultaneously insert dopants into a portion 53 of the semiconductor substrate 11. Thereby to form a p well or an n well. In some embodiments, the opening 321 is provided in a separate operation. Dopant insertion is conducted by various processes such as diffusion or ion implantation. In some embodiments, is the dopant insertion is performed at a temperature range about 1000 to about 1050° C., while the duration of the operation 603 ranges from about 380 to about 400 sec. In certain embodiments, the operation 603 is performed at a temperature range about 1180 to about 1200° C., while the duration of the operation 603 ranges from about 200 to about 230 sec.

Figure 12:
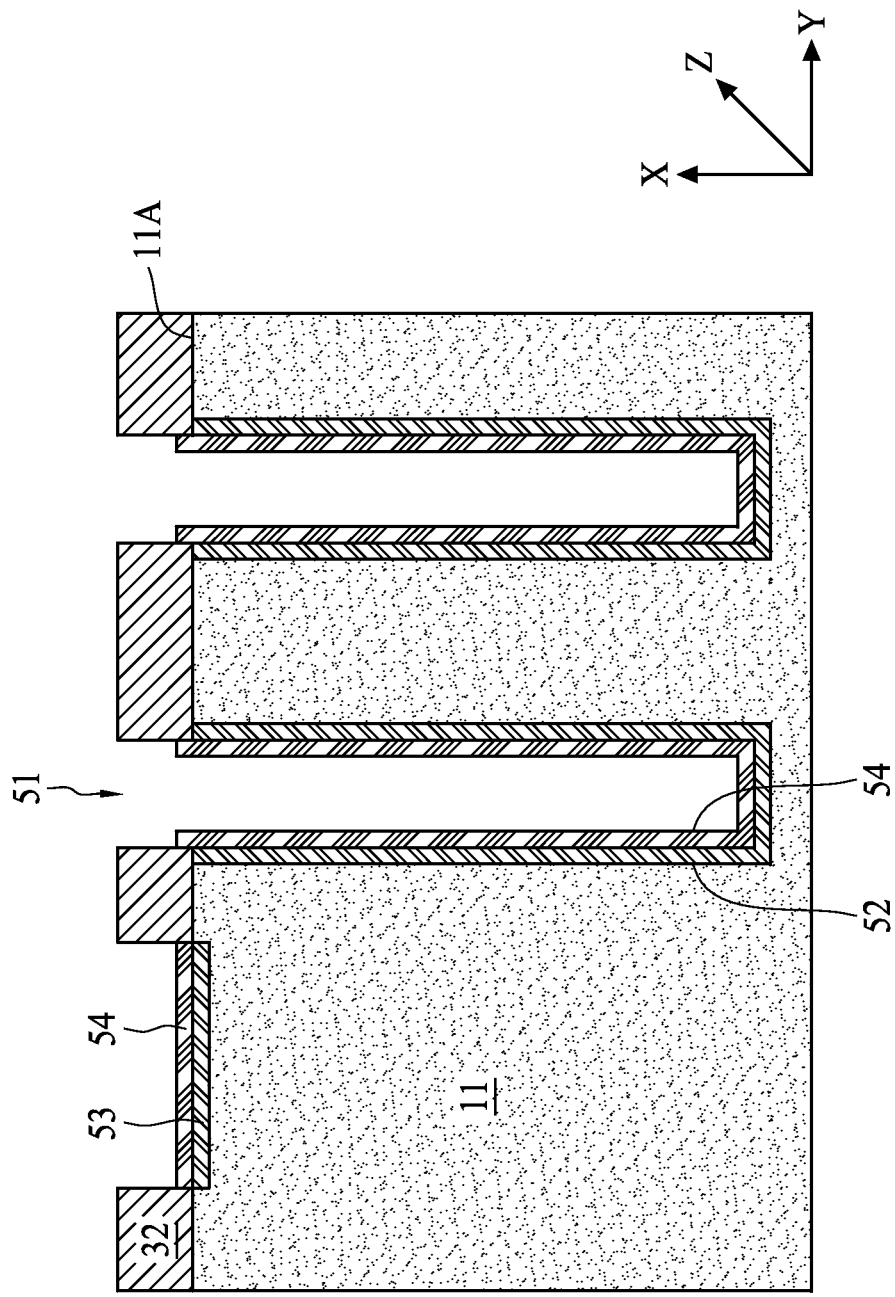

In some embodiments, the method 600 further includes an operation of forming a liner 54 on the portions 52, 53 of the semiconductor substrate 11 as shown in FIG. 12. The liner 54 is made of various dielectric materials as previously discussed. In some embodiments, the liner 54 forming operation is performed by a 1K to 2K TEOS oxide deposition so as to form a liner 54. In some embodiments as in FIG. 13, the method 600 further includes an operation of removing a portion 541 (referring in FIG. 12) of the liner 54. The portion 541 of the liner 54 is on a bottom of the trench 51. In some embodiments, the liner 54 removing operation is performed by etch. In certain embodiments as in FIG. 14, the method 600 further includes an operation of removing an amount of the semiconductor substrate 11 on the bottom of the trench 51. The amount of the semiconductor substrate 11 is doped. The semiconductor substrate 11 removing operation is performed by etch, in which has a selectivity between the semiconductor substrate 11, such as silicon, and the liner 54, such as dielectric. The etch removes about 1 μm semiconductor substrate 11 and divides the portion 52 into two pieces.

Figure 13:
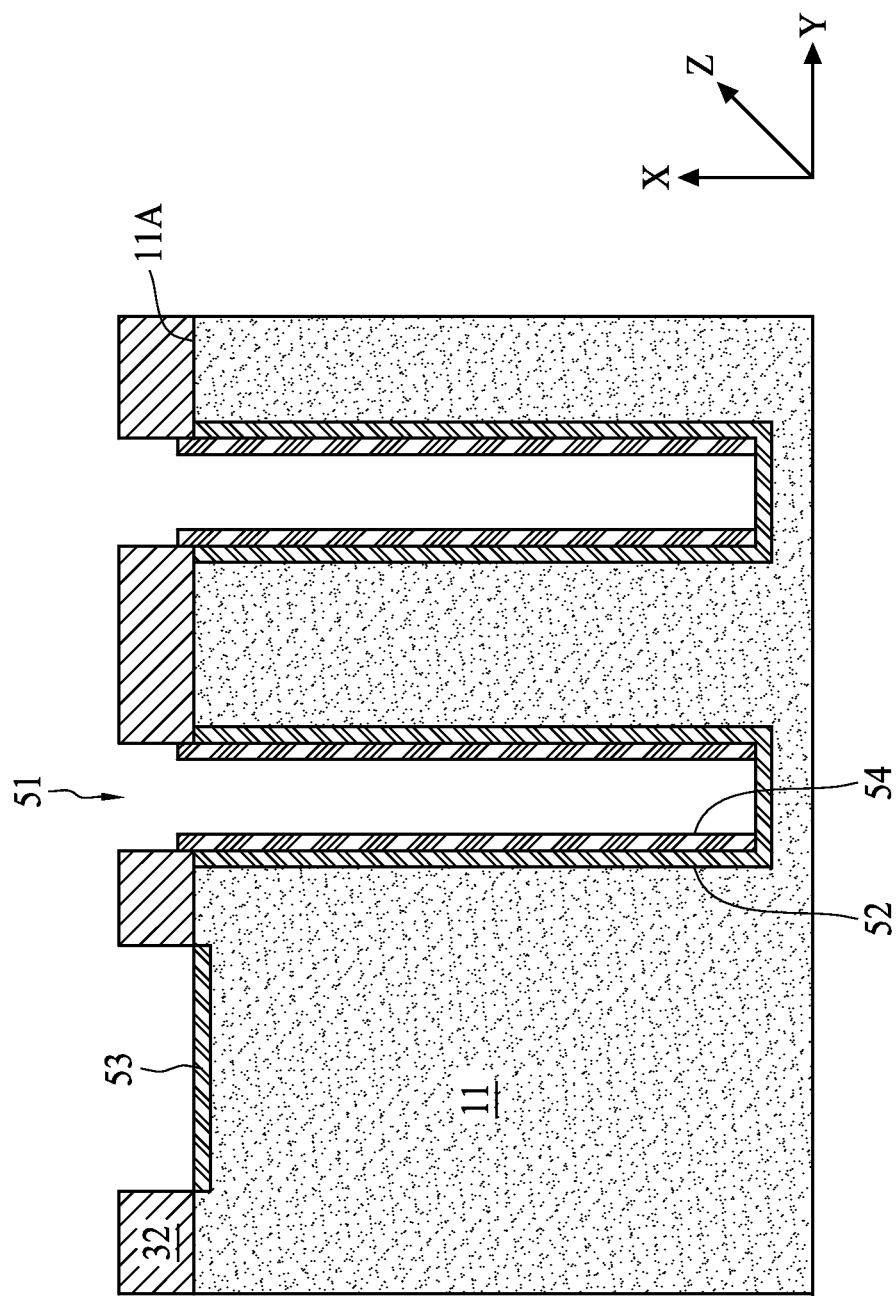
Figure 14:
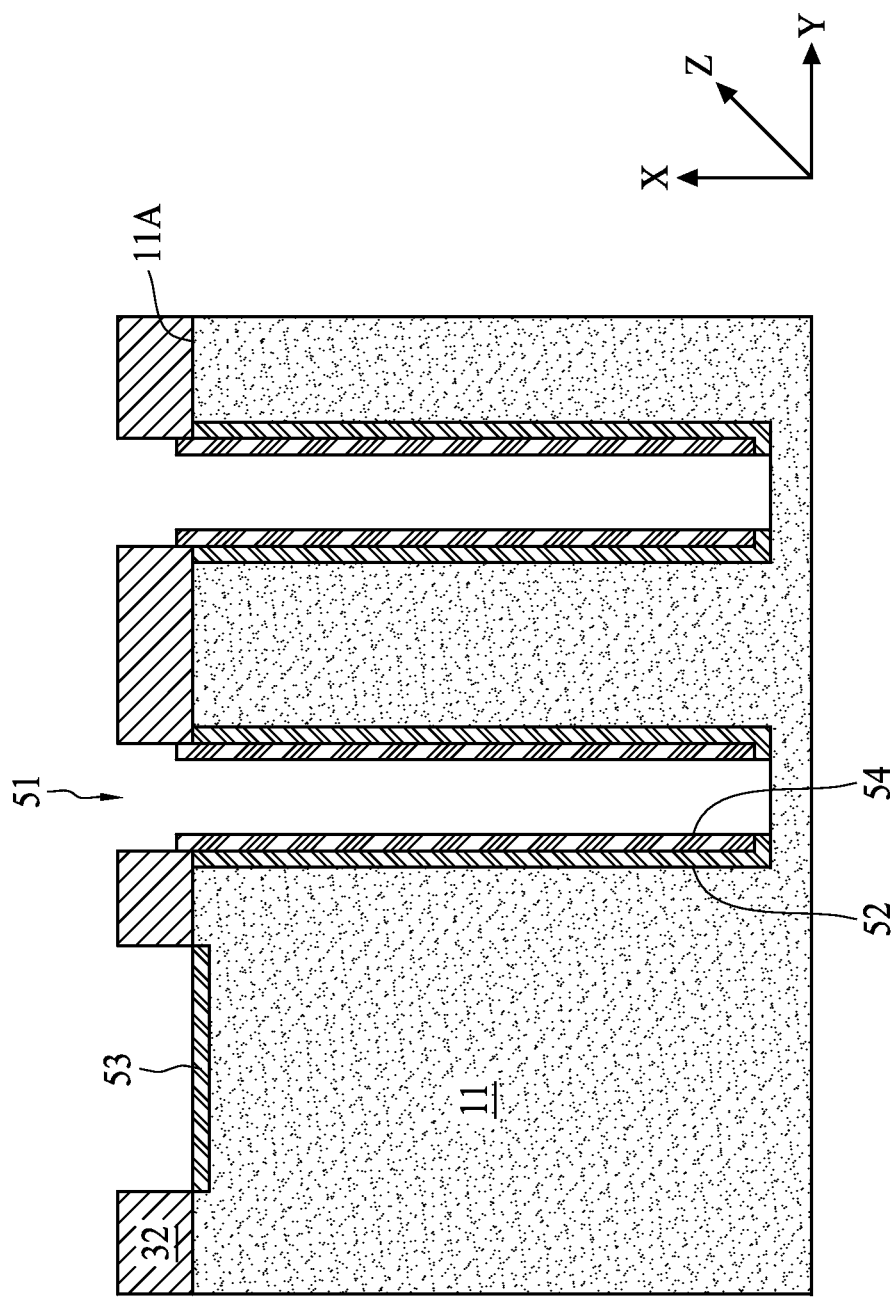
Figure 15:
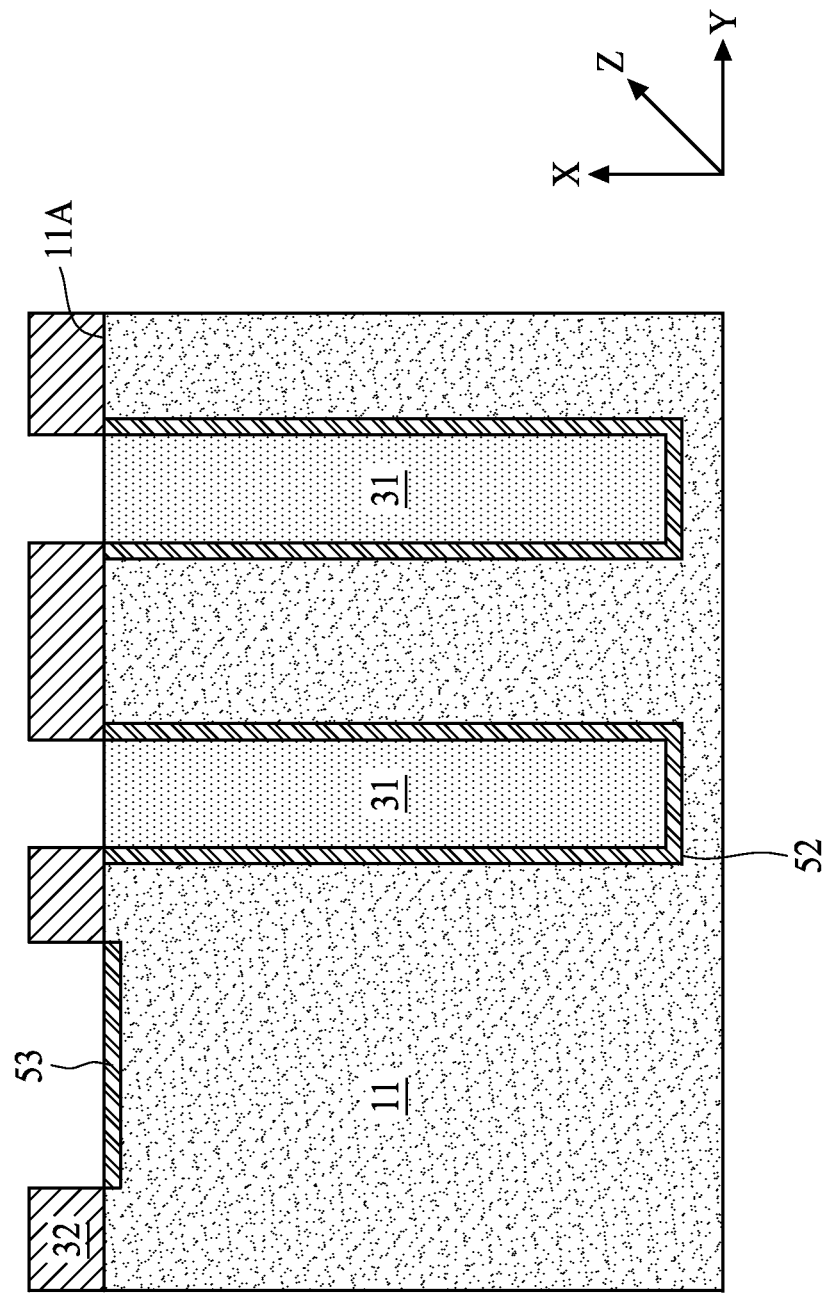
Figure 16:
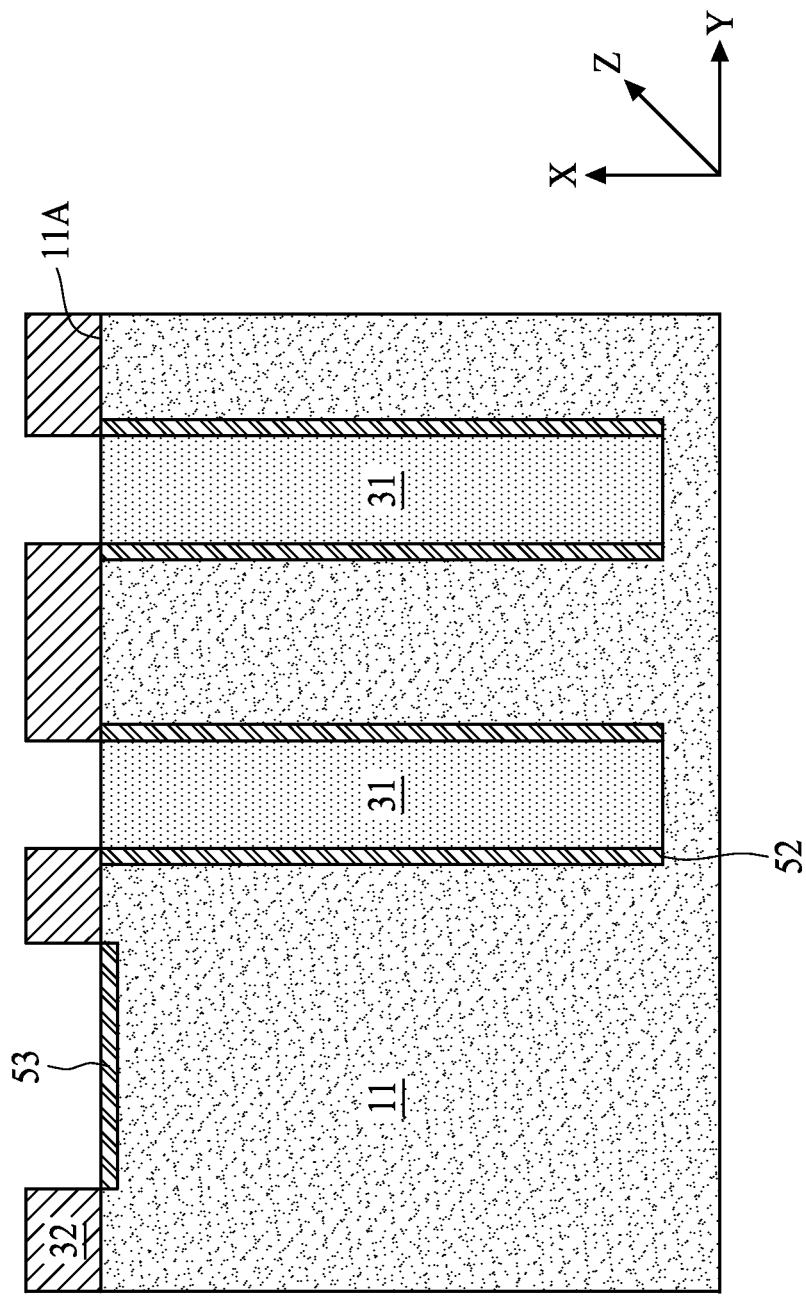

Referring to FIG. 15, the dielectric 31 fills in the trench 51 as shown in FIG. 13 to form isolation. In some embodiments, the dielectric 31 is filled by thermal oxidation or vapor deposition. Referring to FIG. 16, dielectric 31 fills in the trench 51 as shown in FIG. 14 to form isolation.

Figure 17:
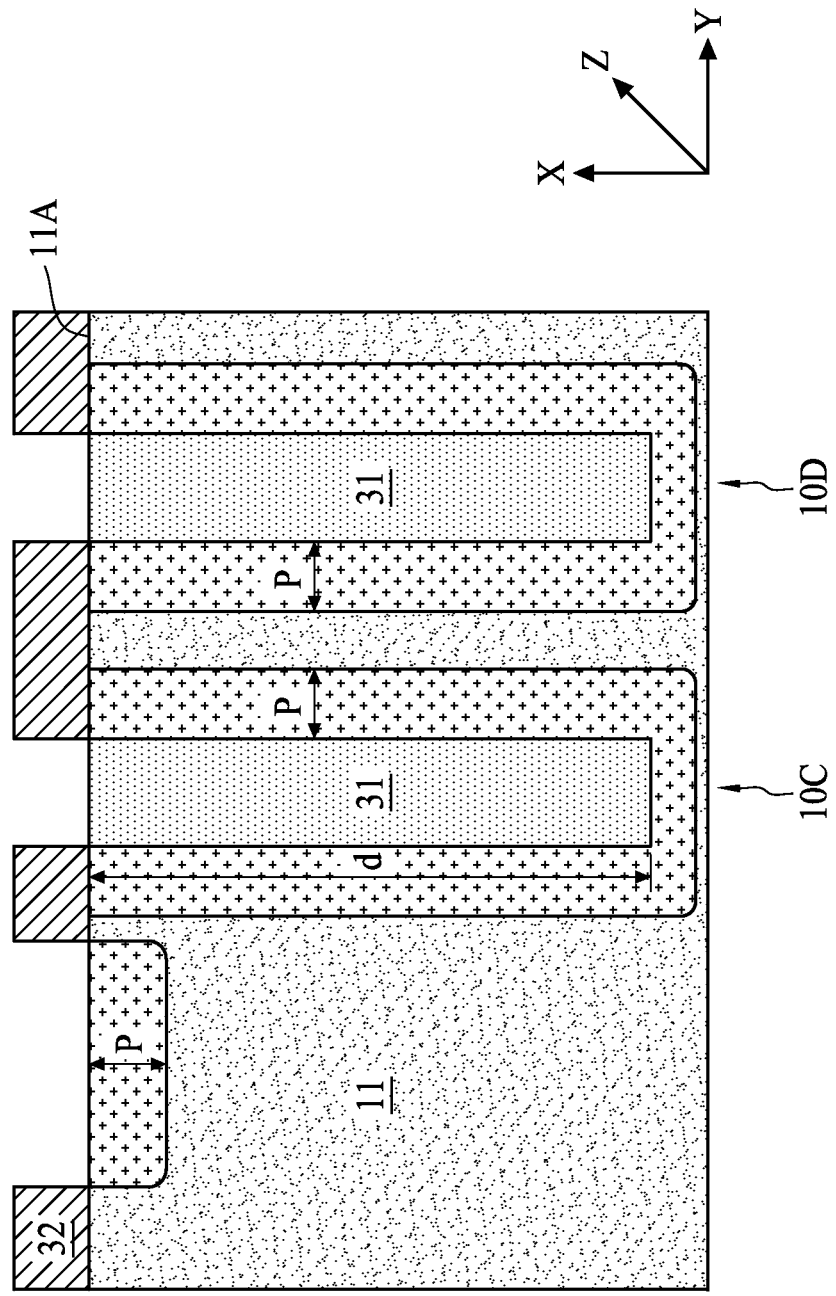
Figure 18:
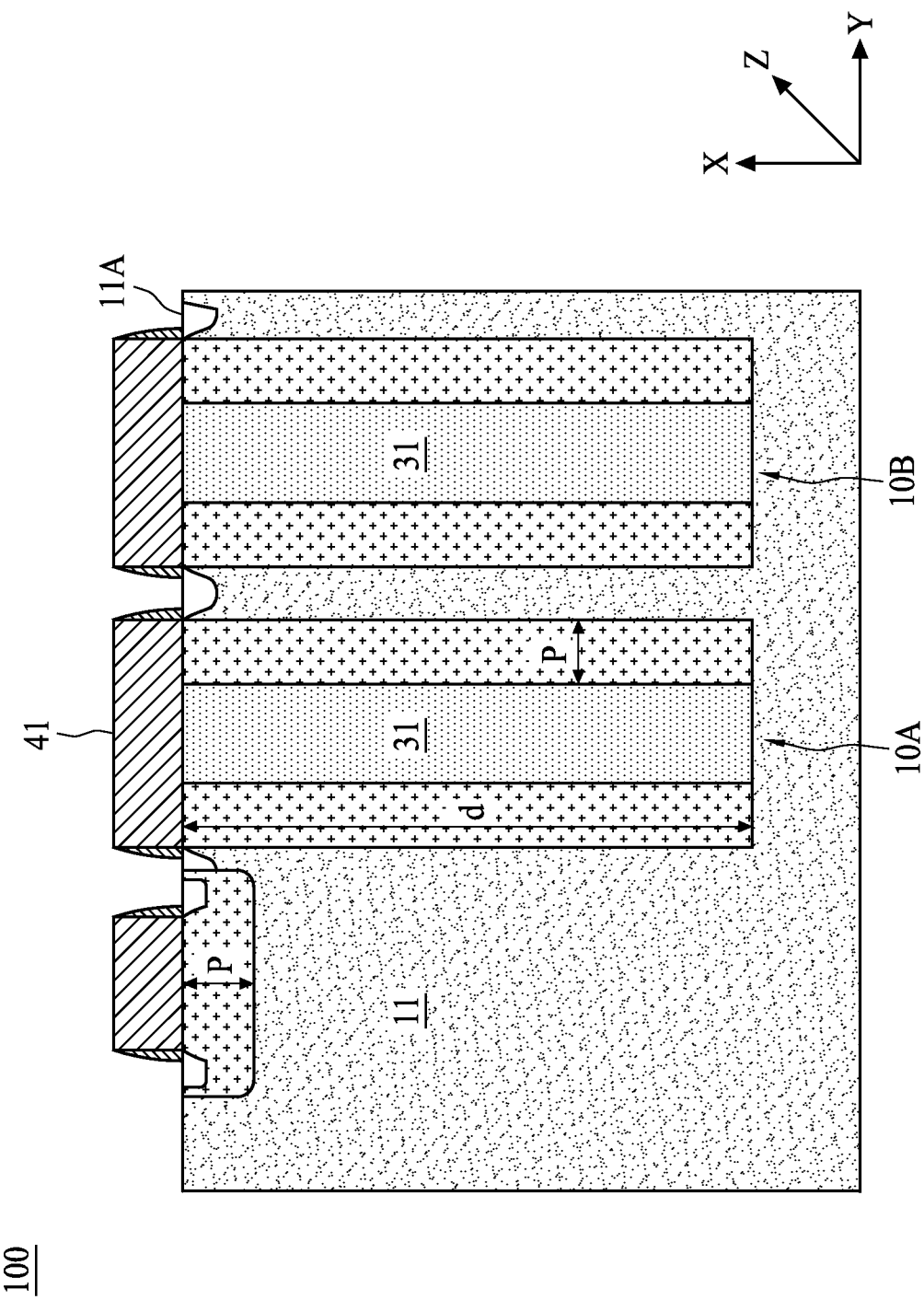
Figure 19:
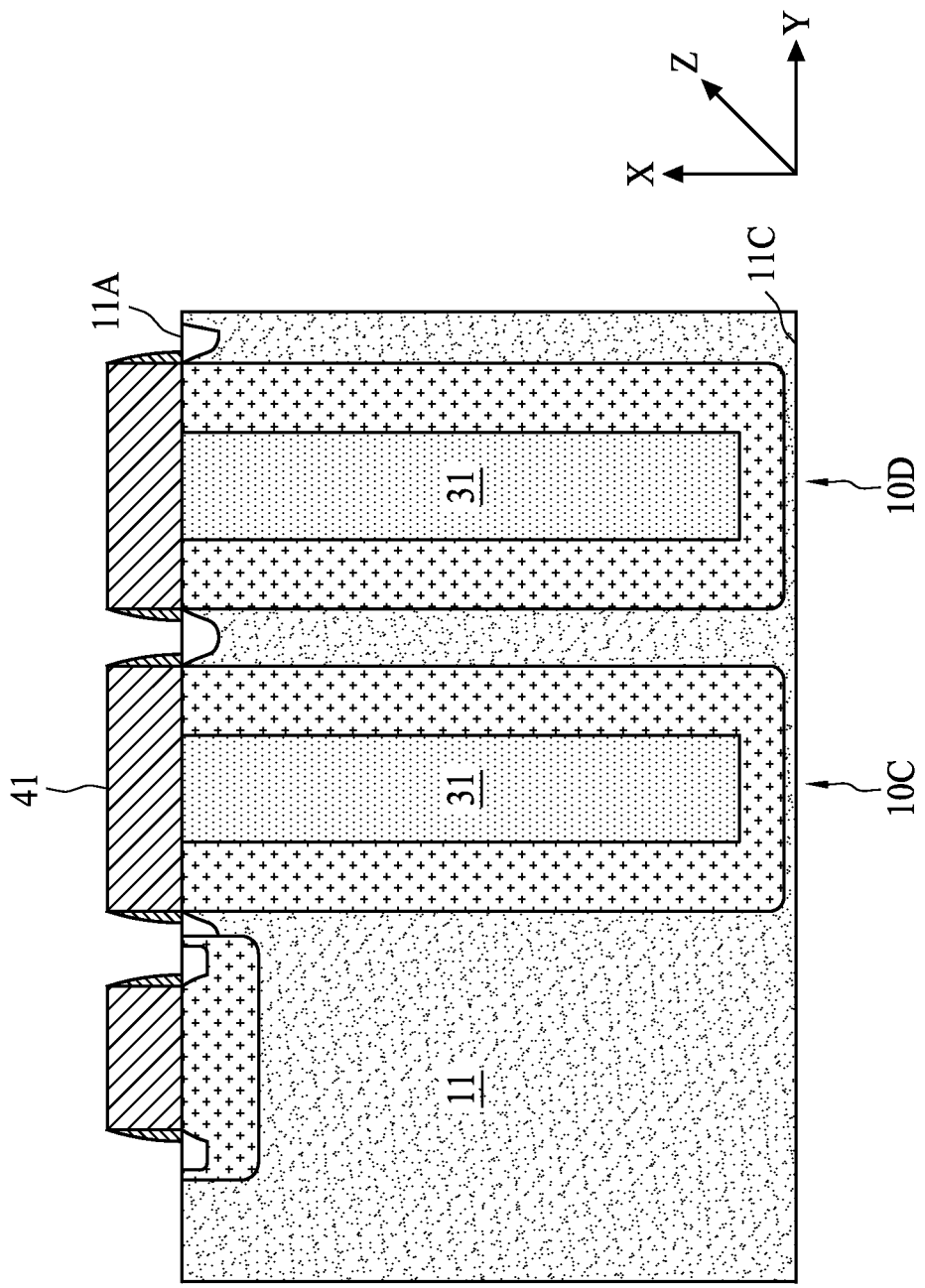

A drive-in is introduced to drive the dopants into a predetermined distance P to form structures as shown in FIGS. 17 and 18. The dopant concentration uniformity along the depth d is within 0.2%. In some embodiments, the drive-in is performed at a temperature range about 1000 to about 1050° C., while the duration of the drive-in ranges from about 280 to about 300 mins. In certain embodiments, the drive-in is performed at a temperature range about 1180 to about 1200° C., while the duration of the operation 605 ranges from about 100 to about 130 mins. After removing the mask layer 32 and forming the cover 41 on the top surface 11A, semiconductor structure 100 is completed as shown in FIG. 18. In some embodiments, after the drive-in is performed shown in FIG. 19, a back side 11C of the structure is grinded and then the epitaxial layer 83 is attached under the semiconductor substrate 11 so as to form semiconductor structure 120 referred to FIG. 3

In some embodiments, a semiconductor structure includes a semiconductor substrate, a first doped region, a second doped region, and a dielectric. The semiconductor substrate has a first conductivity type. The first doped region has a second conductivity type in the semiconductor substrate. The second doped region has the second conductivity type in the semiconductor substrate. The dielectric is in the semiconductor substrate and between the first doped region and the second doped region. The first doped region and the second doped region are symmetrical with reference to the dielectric. The first doped region and the second doped region respectively has an aspect ratio and a dopant concentration uniformity along a depth in the semiconductor substrate. The dopant concentration uniformity is within 0.2% and the aspect ratio of the semiconductor substrate is greater than about 10.

In some embodiments, a semiconductor structure includes a transistor and a p-n junction string. The p-n junction string is electrically coupled to the transistor at one end. Each junction of the p-n junction string includes a doped strip with an aspect ratio extending along a depth in a semiconductor substrate. The dopant concentration uniformity along the depth is within 0.2% and the aspect ratio is greater than about 10.

In some embodiments, a method for fabricating a semiconductor structure includes providing a substrate. The method also includes forming a trench along a depth in the substrate. The trench has an aspect ratio greater than about 10 and the depth is greater than 15 μm. The method also includes inserting dopants into a portion of the substrate. The portion of the substrate surrounds the trench. The method also includes filling a dielectric in the trench. The method also includes driving the dopants into a predetermined distance in the substrate.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing the claims.

Various operations of embodiments are provided herein. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein. It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments.

Further, unless specified otherwise, "first," "second," or the like are not intended to imply a temporal aspect, a spatial aspect, an ordering, etc. Rather, such terms are merely used as identifiers, names, etc. for features, elements, items, etc. For example, a first channel and a second channel generally correspond to channel A and channel B or two different or two identical channels or the same channel.

As used in this application, "or" is intended to mean an inclusive "or" rather than an exclusive "or". In addition, "a" and "an" as used in this application are generally to be construed to mean "one or more" unless specified otherwise or clear from context to be directed to a singular form. Furthermore, to the extent that "includes", "having", "has", "with", or variants thereof are used in either the detailed description or the claims, such terms are intended to be inclusive in a manner similar to "comprising".

What is claimed is:

1. A semiconductor structure, comprising:
  a semiconductor substrate with a first conductivity type;
  an electrical field distribution (EFD) structure, comprising:
    a first doped region with a second conductivity type in the semiconductor substrate;
    a second doped region with the second conductivity type in the semiconductor substrate; and
    a dielectric inside a loop formed by the first doped region and the second doped region;
  an interconnect electrically connecting the first doped region and the second doped region; and
  a cover disposed over the dielectric, the cover comprising a sidewall substantially aligned with an outer sidewall of the first doped region and an outer sidewall of the second doped region.

2. The semiconductor structure of claim 1, further comprising a spacer disposed over the dielectric and attached to the sidewall of the cover.

3. The semiconductor structure of claim 1, wherein the cover is made of a material selected from a group consisting of oxide, metal oxide, nitride, polysilicon, and silicide.

4. The semiconductor structure of claim 1, wherein the first doped region, the second doped region and the dielectric are leveled at respective top surfaces, and the cover comprises a planar bottom surface in contact with the top surfaces of the first doped region, the second doped region and the dielectric.

5. The semiconductor structure of claim 1, wherein the interconnect is arranged through the cover.

6. The semiconductor structure of claim 1, further comprising a third doped region in the semiconductor substrate, wherein the third doped region is spaced from the first doped region with a predetermined distance.

7. The semiconductor structure of claim 6, further comprising two doped areas in the third doped region.

8. The semiconductor structure of claim 1, wherein the dielectric is substantially deep as the first doped region.

9. The semiconductor structure of claim 1, wherein the first conductivity type is n type.

10. The semiconductor structure of claim 1, further comprising a transistor, wherein the first doped region is electrically coupled to the transistor at one end.

11. The semiconductor structure of claim 10, wherein the first doped region is spaced from the transistor with a predetermined distance.

12. The semiconductor structure of claim 10, wherein the transistor comprises an active component disposed on a top surface of the semiconductor substrate.

13. The semiconductor structure of claim 12, wherein the active component comprises a gate electrode and a gate oxide layer, and the gate oxide layer is between the gate electrode and the third doped region.

14. The semiconductor structure of claim 1, further comprising a coupling region contacting the dielectric.

* * * * *